United States Patent
Do et al.

(10) Patent No.: US 8,443,023 B2
(45) Date of Patent: May 14, 2013

(54) FREQUENCY SYNTHESIS RATIONAL DIVISION

(75) Inventors: Viet Linh Do, Carlsbad, CA (US);
Simon Pang, San Diego, CA (US);
Hongming An, San Diego, CA (US);
Jim Lew, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 1401 days.

(21) Appl. No.: 12/120,027

(22) Filed: May 13, 2008

(65) Prior Publication Data
US 2008/0224735 A1   Sep. 18, 2008

Related U.S. Application Data

(63) Continuation-in-part of application No. 11/717,261, filed on Mar. 12, 2007, now Pat. No. 7,560,426, and a continuation-in-part of application No. 11/954,325, filed on Dec. 12, 2007.

(51) Int. Cl.
*G06F 1/02* (2006.01)

(52) U.S. Cl.
USPC .......................... 708/271; 708/650; 327/106

(58) Field of Classification Search .................. None
See application file for complete search history.

(56) References Cited

U.S. PATENT DOCUMENTS

| | | | | |
|---|---|---|---|---|
| 5,021,754 A | * | 6/1991 | Shepherd et al. | 332/128 |
| 5,070,310 A | * | 12/1991 | Hietala et al. | 331/1 A |
| 5,430,764 A | * | 7/1995 | Chren, Jr. | 375/308 |
| 5,705,945 A | * | 1/1998 | Wee | 327/105 |
| 6,236,278 B1 | * | 5/2001 | Olgaard | 331/25 |
| 2005/0156772 A1 | | 7/2005 | Melanson | |
| 2005/0270201 A1 | | 12/2005 | Maloberti et al. | |
| 2007/0241950 A1 | | 10/2007 | Petilli et al. | |
| 2008/0297386 A1 | | 12/2008 | Maloberti et al. | |
| 2009/0066549 A1 | | 3/2009 | Thomsen et al. | |
| 2009/0237284 A1 | | 9/2009 | Rheinfelder et al. | |
| 2009/0289823 A1 | | 11/2009 | Chae et al. | |
| 2009/0325632 A1 | | 12/2009 | Gambini et al. | |
| 2010/0079323 A1 | | 4/2010 | Miao | |
| 2010/0103003 A1 | | 4/2010 | Deval et al. | |
| 2010/0103013 A1 | | 4/2010 | Deval et al. | |
| 2010/0245144 A1 | | 9/2010 | Robbe et al. | |
| 2010/0277355 A1 | | 11/2010 | Chen | |

OTHER PUBLICATIONS

Kozak et al., "A Pipelined Noise Shaping Coder for Fractional-N Frequency Synthesis", IEEE Transactions on Instrumentation and Measurement, vol. 50, No. 5, Oct. 2001, 1154-116.

\* cited by examiner

*Primary Examiner* — Michael D Yaary
(74) *Attorney, Agent, or Firm* — Turocy & Watson, LLP

(57) ABSTRACT

A system and method are provided for synthesizing signal frequencies using rational division. The method accepts a reference frequency value and a synthesized frequency value. In response to dividing the synthesized frequency value by the reference frequency value, an integer value numerator (dp) and an integer value denominator (dq) are determined. The method reduces the ratio of dp/dq to an integer N and a ratio of p/q (dp/dq=N(p/q)), where p/q<1 (decimal). The numerator (p) and the denominator (q) are supplied to a flexible accumulator module, and a divisor is generated as a result. N is summed with a k-bit quotient to create the divisor. In a phase-locked loop (PLL), the divisor and the reference signal are used to generate a synthesized signal having a frequency equal to the synthesized frequency value.

20 Claims, 12 Drawing Sheets

| Mode | total_contribution[4:0] | total_contribution_values |
|---|---|---|
| First Order | contribution1 = $c_1[n]$ | 0,1 |
| Second Order | contribution1 + contribution2 = $c_1[n] + c_2[n] - c_2[n-1]$ | -1,0,1,2 |
| Third Order | contribution1 + contribution2 + contribution3 = $c_1[n] + c_2[n] - c_2[n-1] + c_3[n] - 2c_3[n-1] + c_3[n-2]$ | -3,-2,-1,0,1,2,3,4 |
| Fourth Order | contribution1 + contribution2 + contribution3 + contribution4 = $c_1[n] + c_2[n] - c_2[n-1] + c_3[n] - 2c_3[n-1] + c_3[n-2] + c_4[n] - 3c_4[n-1] + 3c_4[n-2] - c_4[n-3]$ | -7,-6,-5,-4,-3,-2,-1,0,1,2,3,4,5,6,7,8 |

*FIG. 2*
*(Prior Art)*

FREQUENCY SYNTHESIS RATIONAL DIVISION

RELATED APPLICATIONS

This application is a continuation-in-part of a pending application entitled, HIGH SPEED MULTI-MODULUS PRESCALAR DIVIDER, invented by An et al., Ser. No. 11/717,261, filed Mar. 12, 2007 now U.S Pat. No. 7,560,426.

This application is a continuation-in-part of a pending application entitled, FLEXIBLE ACCUMULATOR FOR RATIONAL DIVISION, invented by Do et al., Ser. No. 11/954,325, filed Dec. 12, 2007, Both the above-referenced applications are incorporated herein by reference.

BACKGROUND OF THE INVENTION

1. Field of the Invention

This invention generally relates to a phase-locked loop (PLL) frequency synthesis system and, more particularly, to a frequency synthesis rational number frequency division system, such as might be used in a PLL.

2. Description of the Related Art

Conventional fractional-N frequency synthesizers use fractional number decimal values in their PLL architectures. Even synthesizers that are conventionally referred to as "rational" frequency synthesizers operate by converting a rational number, with an integer numerator and integer denominator, into resolvable or approximated fractional numbers. These frequency synthesizers do not perform well because of the inherent fractional spurs that are generated in response to the lack of resolution of the number of bits representing the divisor in the feedback path of the frequency synthesizer.

FIG. 1 is a schematic block diagram depicting an accumulator circuit capable of performing a division operation (prior art). As noted in "A Pipelined Noise Shaping Coder for Fractional-N Frequency Synthesis", by Kozak et al., IEEE Trans. on Instrumentation and Measurement, Vol. 50, No. 5, October 2001, the depicted $4^{th}$ order device can be used to determine a division ratio using an integer sequence.

The carry outs from the 4 accumulators are cascaded to accumulate the fractional number. The carry outs are combined to reduce quantization noise by adding their contributions as follows:

contribution 1=c1[n];
contribution 2=c2[n]−c2[n−1];
contribution 3=c3[n]−2c3[n−1]+c3[n−2];
contribution 4=c4[n]−3c4[n−1]+3c4[n−2]−c4[n−3];

where n is equal to a current time, and (n−1) is the previous time, Cx[n] is equal to a current value, and Cx[n−1] is equal to a previous value.

FIG. 2 shows the contributions made by the accumulator depicted in FIG. 1 with respect to order (prior art). A fractional number or fraction is a number that expresses a ratio of a numerator divided by a denominator. Some fractional numbers are rational—meaning that the numerator and denominator are both integers. With an irrational number, either the numerator or denominator is not an integer (e.g., n).

Some rational numbers cannot be resolved (e.g., 10/3), while other rational numbers may only be resolved using a large number of decimal (or bit) places. In these cases, or if the fractional number is irrational, a long-term mean of the integer sequence must be used as an approximation.

The above-mentioned resolution problems are addressed with the use of a flexible accumulator, as described in parent application Ser. No. 11/954,325. The flexible accumulator is capable of performing rational division, or fractional division if the fraction cannot be sufficiently resolved, or if the fraction is irrational. The determination of whether a fraction is a rational number may be trivial in a system that transmits at a single frequency, especially if the user is permitted to select a convenient reference clock frequency. However, modern communication systems are expected to work at a number of different synthesized frequencies using a single reference clock. Further, the systems must be easily reprogrammable for different synthesized frequencies, without changing the single reference clock frequency.

It would be advantageous if a means existed for determining a divisor in response to knowing the reference clock frequency and the desired synthesized frequency value. It would be advantageous if this means could determine if the divisor is a rational number. Further, it would be advantageous if the means could calculate the divisor in the form of a fraction that can be input into a flexible accumulator.

SUMMARY OF THE INVENTION

In frequency synthesis applications, there is often a need to use a single reference clock frequency to create multiple output frequencies, where the ratio between output frequency and reference frequency includes a fractional number. The present invention accumulator permits the use of a true rational number as the dividend and divisor, to avoid the use of approximations when the rational number can only be resolved (forming a repeating sequence) using a large number of bit places. Advantageously, the present invention is able to operate in a conventional fractional division mode, if necessary. The present invention provides a solution to PLL frequency synthesis by calculating the divisor needed for utilizing these flexible accumulators to perform either rational or fractional division in the feedback path of the PLL.

Accordingly, a method is provided for synthesizing signal frequencies using rational division. The method accepts a reference frequency value and a synthesized frequency value. In response to dividing the synthesized frequency value by the reference frequency value, an integer value numerator (dp) and an integer value denominator (dq) are determined. The method reduces the ratio of dp/dq to an integer N and a ratio of p/q (dp/dq=N(p/q)), where p/q<1 (decimal). The numerator (p) and the denominator (q) are supplied to a flexible accumulator module, and a divisor is generated as a result. N is summed with a k-bit quotient, to create the divisor. In a PLL, the divisor and the reference signal are used to generate a synthesized signal having a frequency equal to the synthesized frequency value.

More explicitly, the ratio of p/q is formed by defining a resolution limit of j radix places. After setting q=dq, p is determined. Then, p and q are supplied to a flexible accumulator module enabled for rational division when p can be represented as an integer using j, or less, radix places. Alternately, a non-resolvable number r is generated, and N(r/q) is supplied to a flexible accumulator module enabled for fractional division, when p cannot be represented as an integer using j radix places.

Additional details of the above-described method and frequency synthesis system for rational division are presented below.

BRIEF DESCRIPTION OF THE DRAWINGS

FIG. 2 shows the contributions made by the accumulator depicted in FIG. 1 with respect to order (prior art).

DETAILED DESCRIPTION

Figure 1:
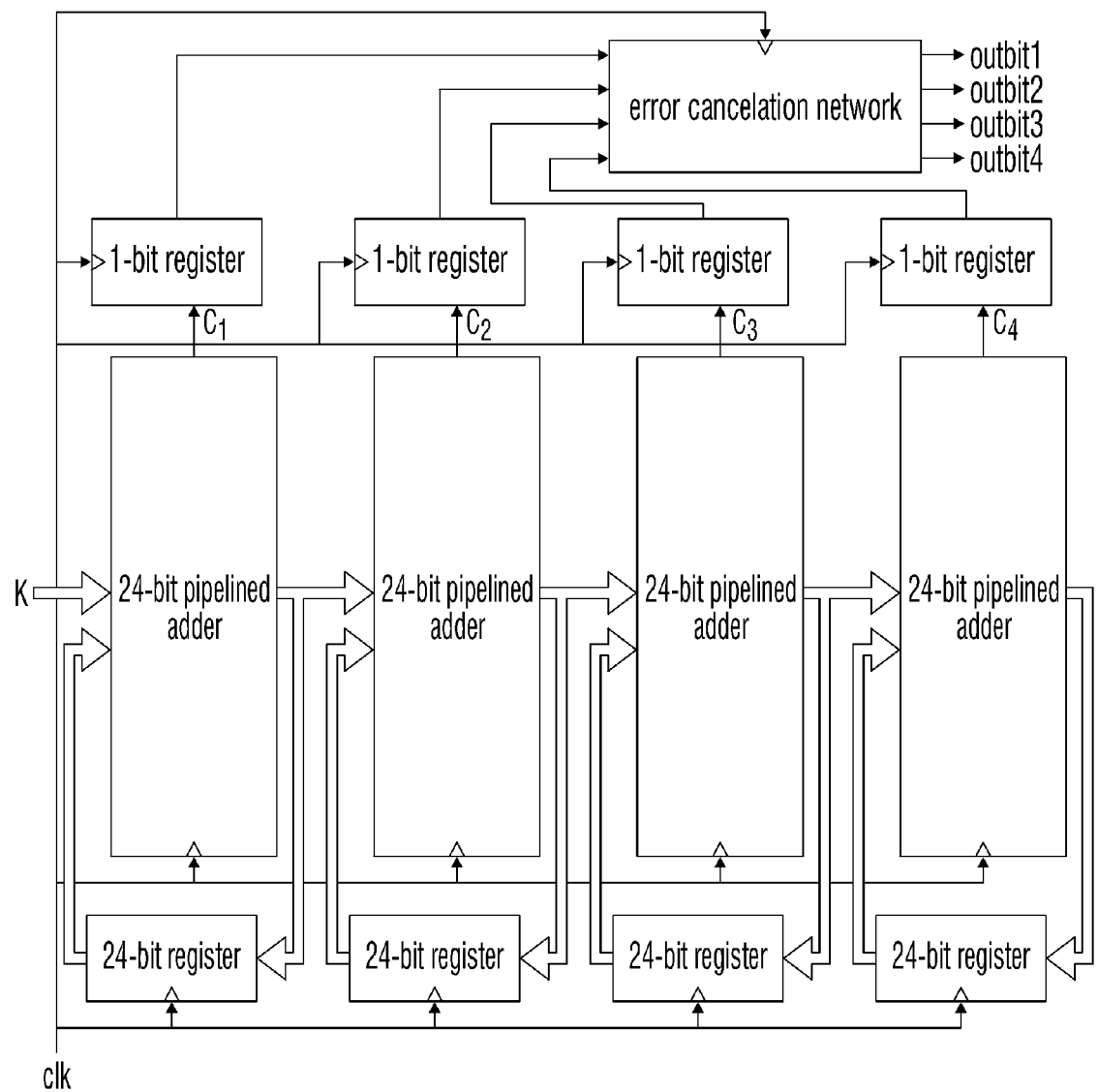
FIG. 1 is a schematic block diagram depicting an accumulator circuit capable of performing a division operation (prior art).

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated that the various systems may include additional components, modules, etc. and/or may not include all of the components, modules etc. discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 3:
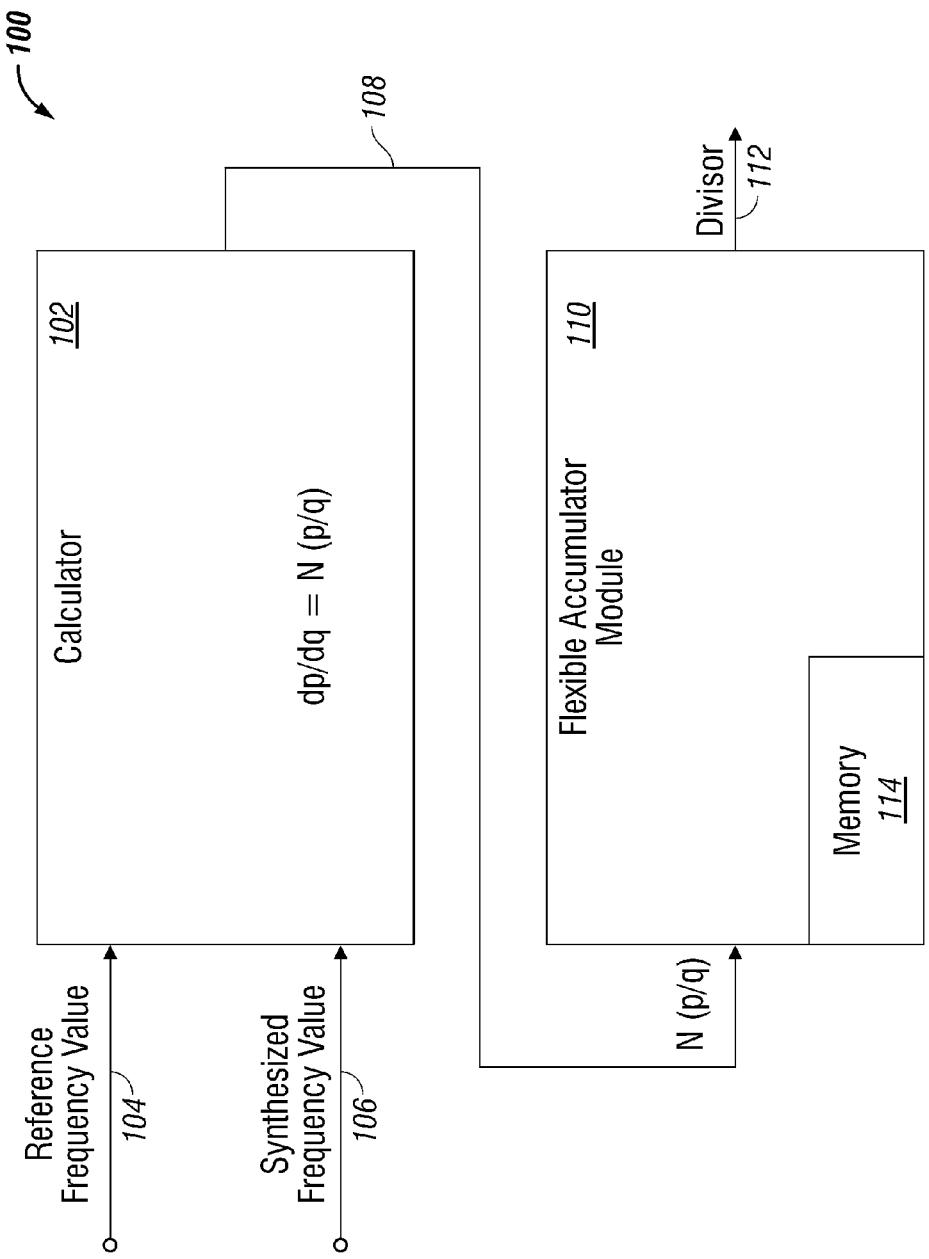
FIG. 3 is a schematic block diagram depicting a system for synthesizing signal frequencies using rational division.

FIG. 3 is a schematic block diagram depicting a system for synthesizing signal frequencies using rational division. The system 100 comprises a calculator 102 having an input on line 104 to accept a reference frequency value and an input on line 106 to accept a synthesized frequency value. The calculator 102 divides the synthesized frequency value by the reference frequency value, and determines an integer value numerator (dp) and an integer value denominator (dq). The calculator 102 reduces the ratio of dp/dq to an integer N and a ratio of p/q (dp/dq N(p/q)), where p/q<1 (decimal). The calculator 102 supplies N(p/q), where p is a numerator and q is a denominator, at an output on line 108. A flexible accumulator module 110 has an input on line 108 to accept N(p/q) and an output on line 112 to supply a divisor. For example, the calculator 102 may supply an n-bit binary numerator and an (n+1)-bit binary denominator. The divisor may be stored in a tangible memory medium (e.g., random access memory (RAM) or non-volatile memory) for subsequent use, as described below.

Figure 4:
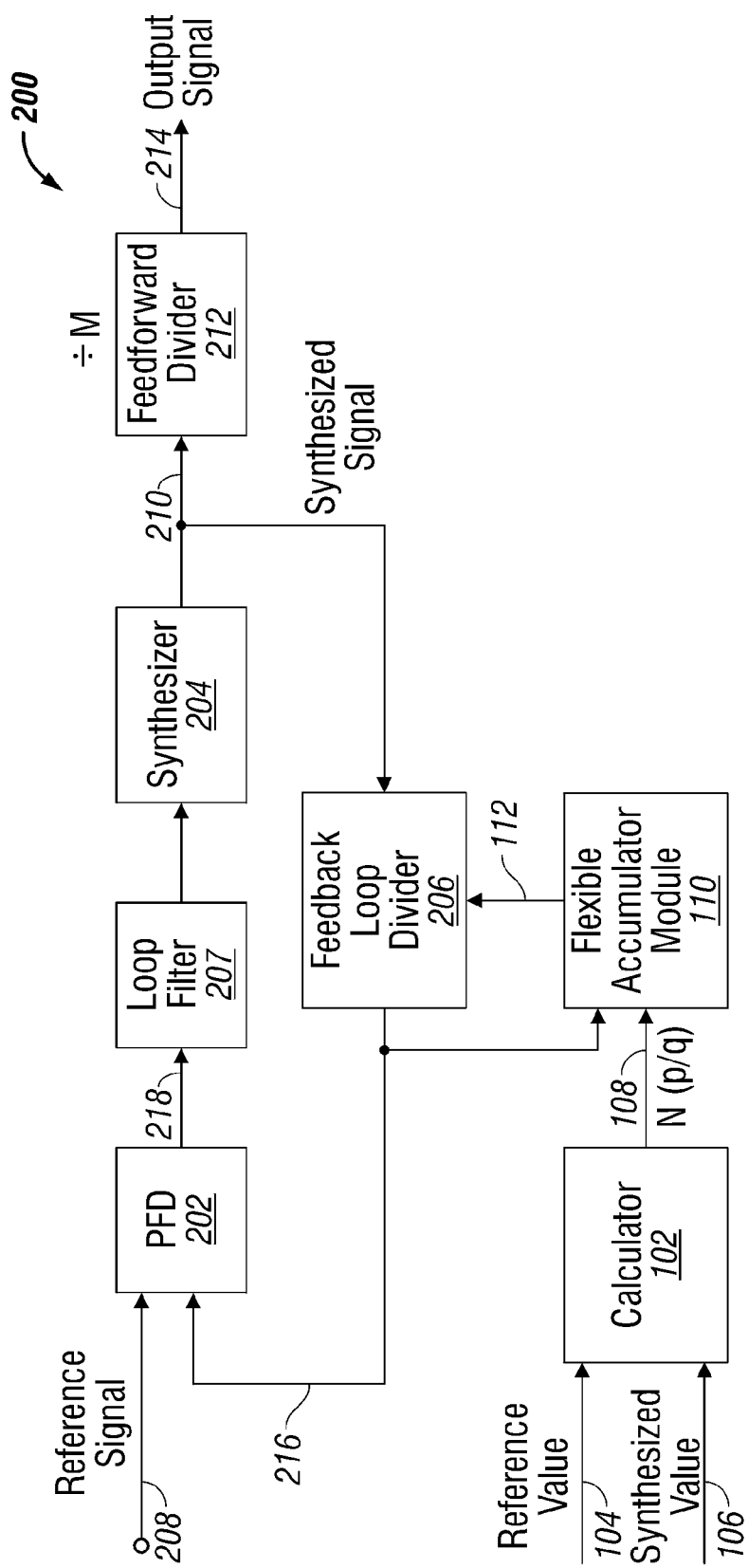
FIG. 4 is a schematic block diagram depicting the system of FIG. 3 is the context of a phase-locked loop (PLL).

FIG. 4 is a schematic block diagram depicting the system of FIG. 3 is the context of a phase-locked loop (PLL) 200. The PLL 200 includes a phase/frequency detector (PFD) 202, a frequency synthesizer 204, and a feedback loop divider 206. Typically, a PLL may also include a loop filer and charge pump 207. The PFD 202 accepts a reference signal on line 208 having a frequency equal to the reference frequency value. The frequency synthesizer 204 generates a synthesized signal on line 210 having a frequency equal to the synthesized frequency value. The flexible accumulator module 110 sums N with a k-bit quotient, creates the divisor, and supplies the divisor to the feedback loop divider 206 on line 112.

Figure 5:
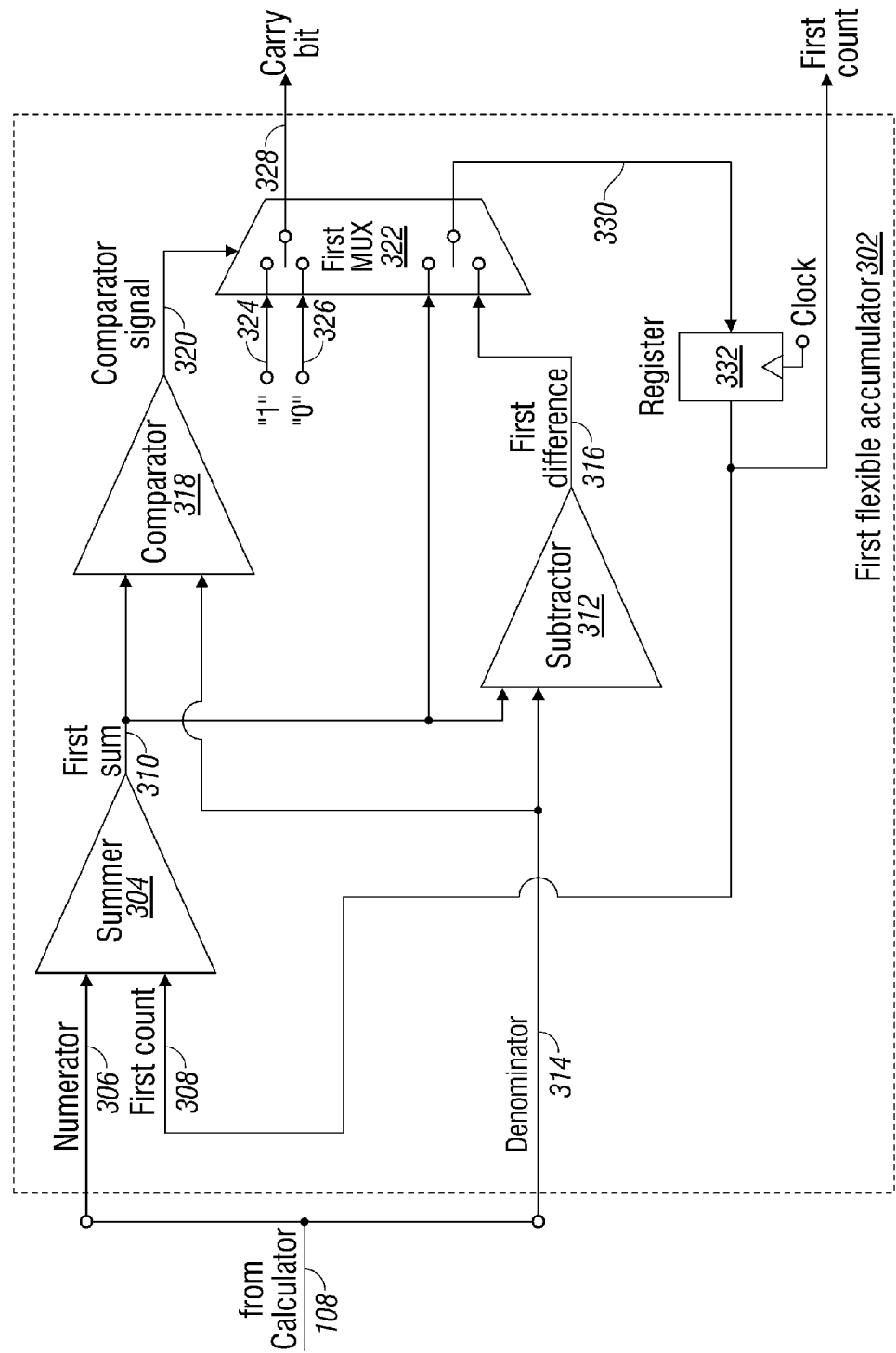
FIG. 5 is a schematic block diagram depicting a first flexible accumulator of the flexible accumulator module.

FIG. 5 is a schematic block diagram depicting a first flexible accumulator of the flexible accumulator module. A flexible accumulator is capable of either rational or fractional division. As explained in more detail below, rational division relies upon the use of a numerator (dividend) and a denominator (divisor) that are used to form a true rational number. That is, the numerator and denominator are integer inputs to the flexible accumulator. Alternately stated, the input need not be a quotient derived from a numerator and denominator.

The first flexible accumulator 302 includes a first summer 304 having an input on line 306 to accept a binary numerator (p). Summer 304 has an input on line 308 to accept a binary first count from a previous cycle and an output on line 310 to supply a binary first sum of the numerator and the first count.

A first subtractor 312 has an input on line 314 to accept a binary denominator (q), an input on line 310 to accept the first sum, and an output on line 316 to supply a binary first difference between the first sum and the denominator. Note: the numerator (p) and denominator (q) on lines 306 and 314, respectively, are components of the information supplied by the calculator on line 108. A first comparator 318 has an input on line 310 to accept the first sum, an input on line 314 to accept the denominator, and an output on line 320 to supply a first comparator signal. A first multiplexer (MUX) 322 has an input to accept carry bits. A "1" carry bit is supplied on line 324 and a "0" carry bit is supplied on line 326. The MUX 322 has a control input on line 320 to accept the first comparator signal, and an output on line 328 to supply a first carry bit in response to the first comparator signal.

More explicitly, the first MUX 322 supplies a binary "1" first carry bit on line 328 if the first comparator signal on line 320 indicates that the first sum is greater than the denominator. The MUX 322 supplies a binary "0" first carry bit if the first comparator signal indicates that the first sum is less than or equal to the denominator. The first MUX 322 has an input on line 310 to accept the first sum, an input on line 316 to accept the first difference, and an output on line 330 to supply the first count in response to the comparator signal. Note: the first count from first MUX 322 on line 330 becomes the first count from a subsequent cycle on line 308 after passing through clocked register or delay circuit 332. As explained in more detail below, line 308 may also connected as an output port (count) to another, higher order flexible accumulator.

The first MUX 322 supplies the first difference as the first count on line 308 for the subsequent cycle if the first comparator signal indicates that the first sum is greater than the denominator. The first MUX 322 supplies the first sum as the first count in the subsequent cycle if the first comparator signal indicates that first sum is less than or equal to the denominator. Alternately but not shown, the accumulator may be comprised of two MUX devices, one for selecting the carry bit and one for selecting the first count.

In one aspect, the first summer accepts an n-bit binary numerator on line 306, an n-bit first count on line 308 from the previous cycle, and supplies an (n+1)-bit first sum on line 310. The first subtractor 312 accepts an (n+1)-bit binary denominator on line 314 and supplies an n-bit first difference on line 316.

Typically, first summer 304 accepts the numerator with a value, and the first subtractor 312 accepts the denominator with a value larger than the numerator value. In one aspect, the combination of the numerator and denominator form a rational number. That is, both the numerator and denominator are integers. However, the numerator and denominator need not necessarily form a rational number. Alternately expressed, the first summer 304 may accept an n-bit numerator that is a repeating sequence of binary values, or the numerator may be the most significant bits of a non-repeating sequence. The non-repeating sequence may be represented by r, an irrational number or a rational number that cannot be resolved (does not repeat) within a span of n bits. In this aspect, the first subtractor 312 accepts an (n+1)-bit denominator with a value equal to decimal 2(n+1). Additional details of the flexible accumulator module can be found in parent application Ser. No. 11/954,325.

Figure 6:
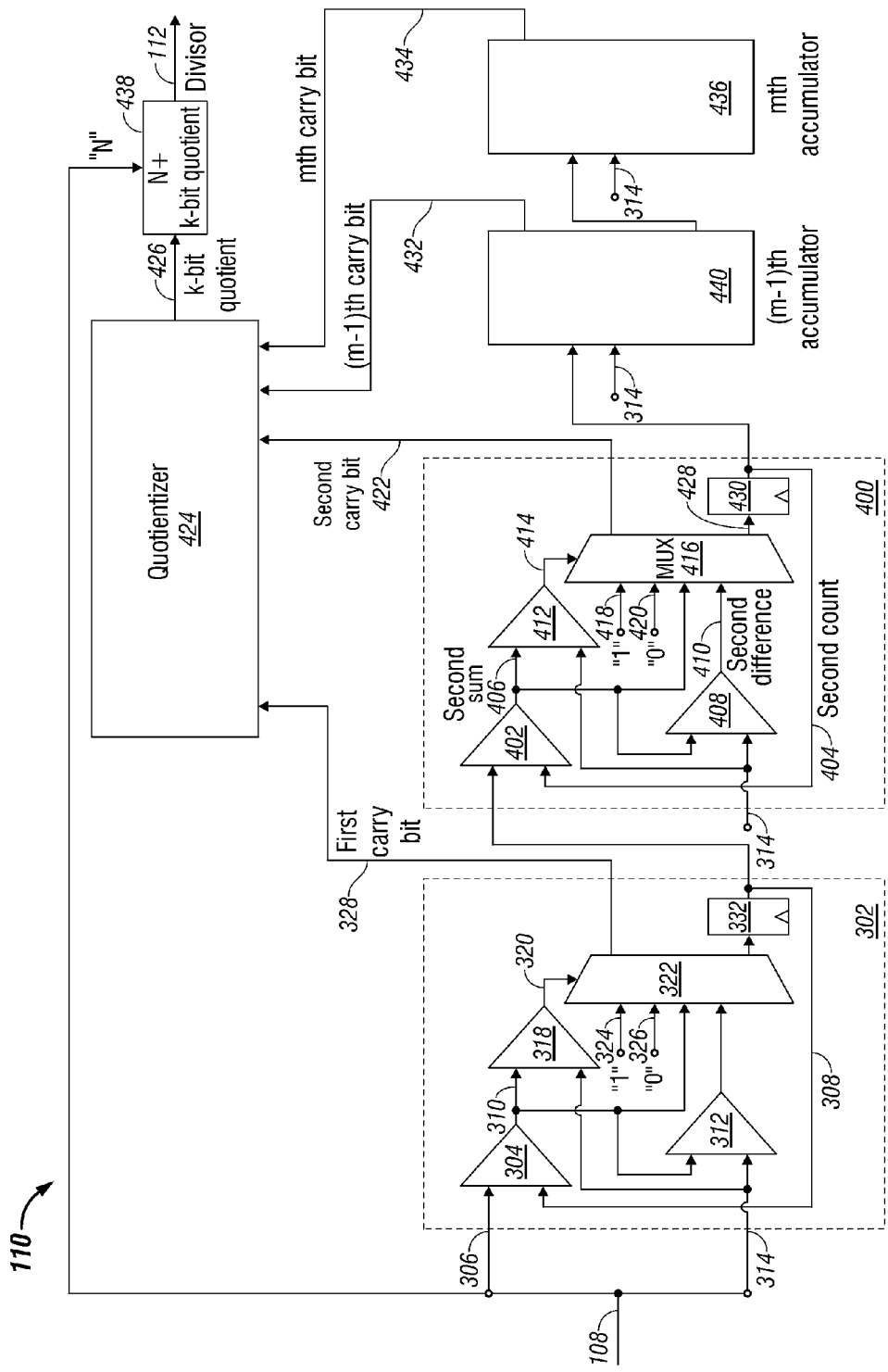
FIG. 6 is a schematic block diagram depicting the flexible accumulator module as a plurality of series-connected flexible accumulators.

FIG. 6 is a schematic block diagram depicting the flexible accumulator module as a plurality of series-connected flexible accumulators. Generally, the flexible accumulator module generates a binary sequence from each flexible accumulator and uses a plurality of binary sequences to generate the k-bit quotient.

A quotientizer 424 has an input on line 328 to accept the first binary sequence, an input on line 422 to accept the second binary sequence, and an output on line 426 to supply a k-bit quotient generated from the first and second binary sequences. In total, the flexible accumulator module 110 comprises m flexible accumulators, including an (m−1)th accumulator 440 and an mth accumulator 436. In this example, m=4. However, the module 110 is not limited to any particular number of flexible accumulators. Thus, the quotientizer has inputs 328, 422, 432, and 434 to accept m=4 binary sequences and the output 426 supplies a k-bit quotient generated from the m binary sequences. In one aspect, the quotientizer 424 derives the quotient as shown in FIGS. 1 and 2, and as explained below. Circuit 438 sums the k-bit quotient on line 426 with the integer N to supply the divisor on line 112.

A fourth order system, using four series-connected accumulators has been depicted as an example. However, it should be understood that the system is not limited to any particular number of accumulators. Although the above-described values have been defined as binary values, the system could alternately be explained in the context of hexadecimal or decimal numbers.

Figure 7:
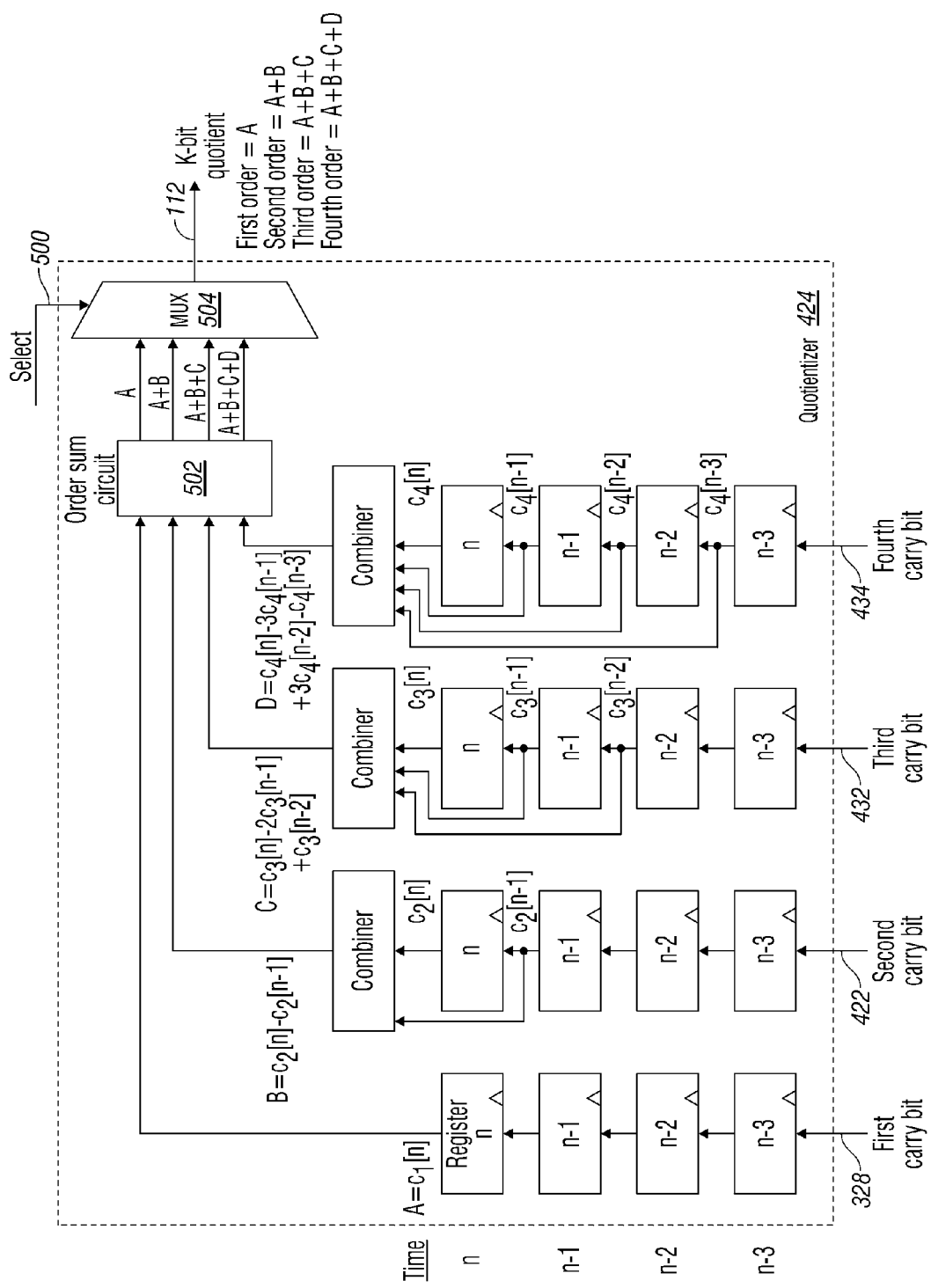
FIG. 7 is a schematic block diagram depicting the quotientizer of FIG. 6 in greater detail.

FIG. 7 is a schematic block diagram depicting the quotientizer of FIG. 6 in greater detail. Returning to the calculation of the quotient, the number of bits required from each contribution block is different. From FIG. 2 it can see that each order requires a different number of bits. For example, the first contribution (contributions) has only two values: 0 and 1. So, only 1 bit is needed. There is no need for a sign bit, as the value is always positive. The second contribution has possible 4 values: −1, 0, 1, and 2. So, 3 bits are needed, including 1 sign bit. The third contribution has 7 values: −3 to 4. So, 4 bits are required, including 1 sign bit. The fourth contribution has 15 values: −7 to 8. So, 5 bits are required, including 1 sign bit.

To generalize for "k" (the k-bit quotient), Pascal's formula may be used to explain how many bits is necessary for each contribution (or order). For an m-order calculator, there are m flexible accumulators and m binary sequences. Each binary sequence (or carry bit) is connected to the input of one of the m sequences of shift registers. Thus, there are m signals combined from the m shift register sequences, corresponding to the m-binary sequences (or m-th carry bit) found using Pascal's formula. A 4-order calculator is shown in FIG. 7, with 4 shift register (delay) sequences, with each shift register sequence including 4 shift registers.

As a simplified alternative, each contribution may be comprised of the same number of bits, k, which is the total contribution (or order) for all contributions. These k-bit contributions are 2 complement numbers. In FIG. 2, k is equal to 5 bits [4:0].

The accumulator does not generate a sign bit. However, the carry outs from the accumulators are modulated in the calculator and the sign bit is generated. For example, the $2^{nd}$ order contribution=c2[n]−c2[n−1]. If c2[n]=0 and c2[n−1]=1, then the $2^{nd}$ order contribution=0−1=−1. Similarly, the third order contribution=c3[n]−2c3[n−1]+c3[n−2]. If c3[n]=0, c3[n−1]=1, and c3[n−2]=0, then the $3^{rd}$ order contribution=0−2×1+0=−2. For the $4^{th}$ order contribution=c4[n]−3c4[n−1]+3c4[n−2]−c4[n−3]. If c4[n]=0, c4[n−1]=1, c4[n−2]=0, and c4[n−3]=1, then the $4^{th}$ order contribution=0−3×1+3×0−1=−4.

These contributions are added together in the "order sum circuit" 502 on the basis of order, and the order is chosen using MUX 504 and the select signal on line 500. FIG. 7 depicts one device and method for generating a quotient from accumulator carry bits. However, the system of FIG. 6 might also be enabled using a quotientizer that manipulates the accumulator carry bits in an alternate methodology.

Returning to FIG. 4, in one aspect the calculator 102 defines a resolution limit of j radix places, sets q=dq, and determines p. The calculator 102 supplies p and q to a flexible accumulator module 110 enabled for rational division when p can be represented as an integer using j, or less, radix places. Alternately, the calculator 102 supplies N(r/q) to a flexible accumulator module enabled for fractional division, where r is a non-resolvable number, when p cannot be represented as an integer using j radix places. When enabled for fractional division, r is supplied as the "numerator" on line 306 (see FIG. 5). Then, the "denominator" on line 314 is represented as an integer with a value larger than the fractional number. For example, the fractional number of line 306 may be an unresolved 31-bit binary number and the integer on line 314 may be a 32-bit number where the highest order radix place is "1" and all the lower orders are "0". Alternately stated, r may be a 31-bit non-resolvable numerator, and q a 32-bit denominator with a value equal to decimal $2^{32}$. In one aspect, r is "rounded-off" to a resolvable value.

In one aspect, the PLL 200 of FIG. 4 includes a feedforward divider 212 to accept the synthesized signal on line 210 and an output on line 214 to supply an output signal having a frequency=(synthesized signal frequency)/M. In this aspect, the flexible accumulator module 110 creates the divisor by summing N, the k-bit quotient, and M. Likewise, the calculator 102 reduces to ratio M(dp/dq)=N(p/q)).

Figure 8:
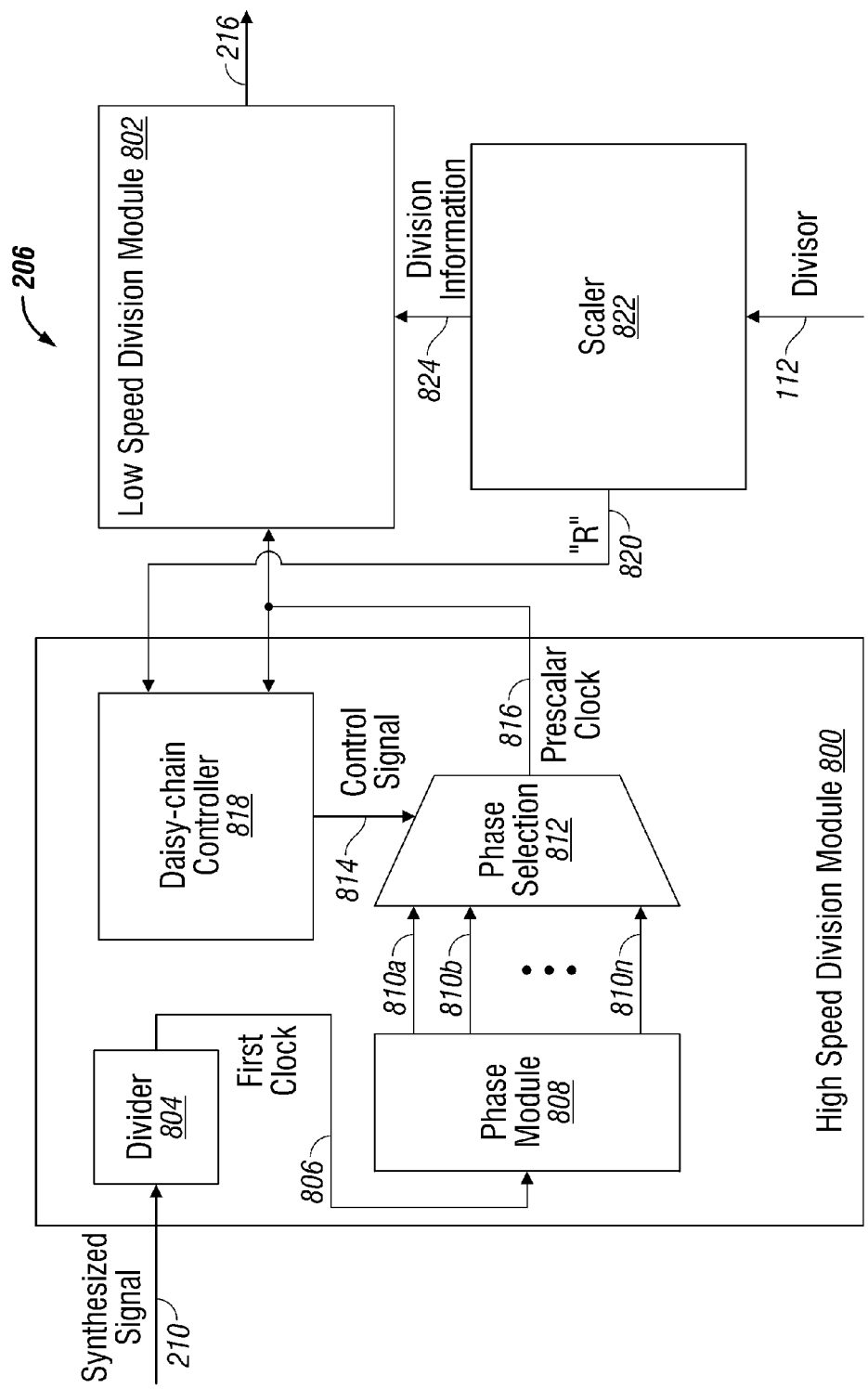
FIG. 8 is a schematic block diagram depicting the feedback loop divider of FIG. 4 is greater detail.

FIG. 8 is a schematic block diagram depicting the feedback loop divider of FIG. 4 is greater detail. The feedback loop divider 206 includes a high-speed division module 800 and a low-speed division module 802. The high-speed module 800 includes a divider 804 having an input on line 210 to accept the synthesized signal and an output on line 806 to supply a first clock signal having a frequency equal to the (synthesized signal frequency)/J. A phase module 808 has an input on line 806 to accept the first clock and an output on lines 810a through 810n to supply a plurality of phase outputs, each having the first clock frequency. Typically, the phase module 808 generates a first clock with a first number of equally-spaced phase outputs. For example, n may be equal to 8, meaning that 8 first clock signals are supplied, offset from the nearest adjacent phase by 45 degrees. A phase selection multiplexer 812 has an input on lines 810a-810n to accept the plurality of first clock phase outputs, an input on line 814 to accept a control signal for selecting a first clock signal phase, and an output on line 816 to supply a prescalar lock with a frequency equal to the (synthesized signal frequency)/R, here R=J·S.

A daisy-chain register controller 818 has an input on line 820 accept the pre-divisor value R and an output on line 814 to supply the control signal for selecting the first clock phase outputs. A low-speed module 822 has an input on line 816 to accept the prescalar clock and an output on line 216 to supply a divided prescalar clock with a frequency equal to the (divisor/R). A scaler 822 accepts the divisor on line 112, supplies the R value of line 820, and supplies division information to the low speed divider 802 on line 824. Returning briefly to FIG. 4, the PFD 202 compares the divided prescalar clock frequency on line 216 to the reference clock frequency and generates a synthesized signal correction voltage on line 218.

In some aspects, the divided prescalar clock signal on line 216 is feedback to the flexible accumulator module 110.

Figure 9:
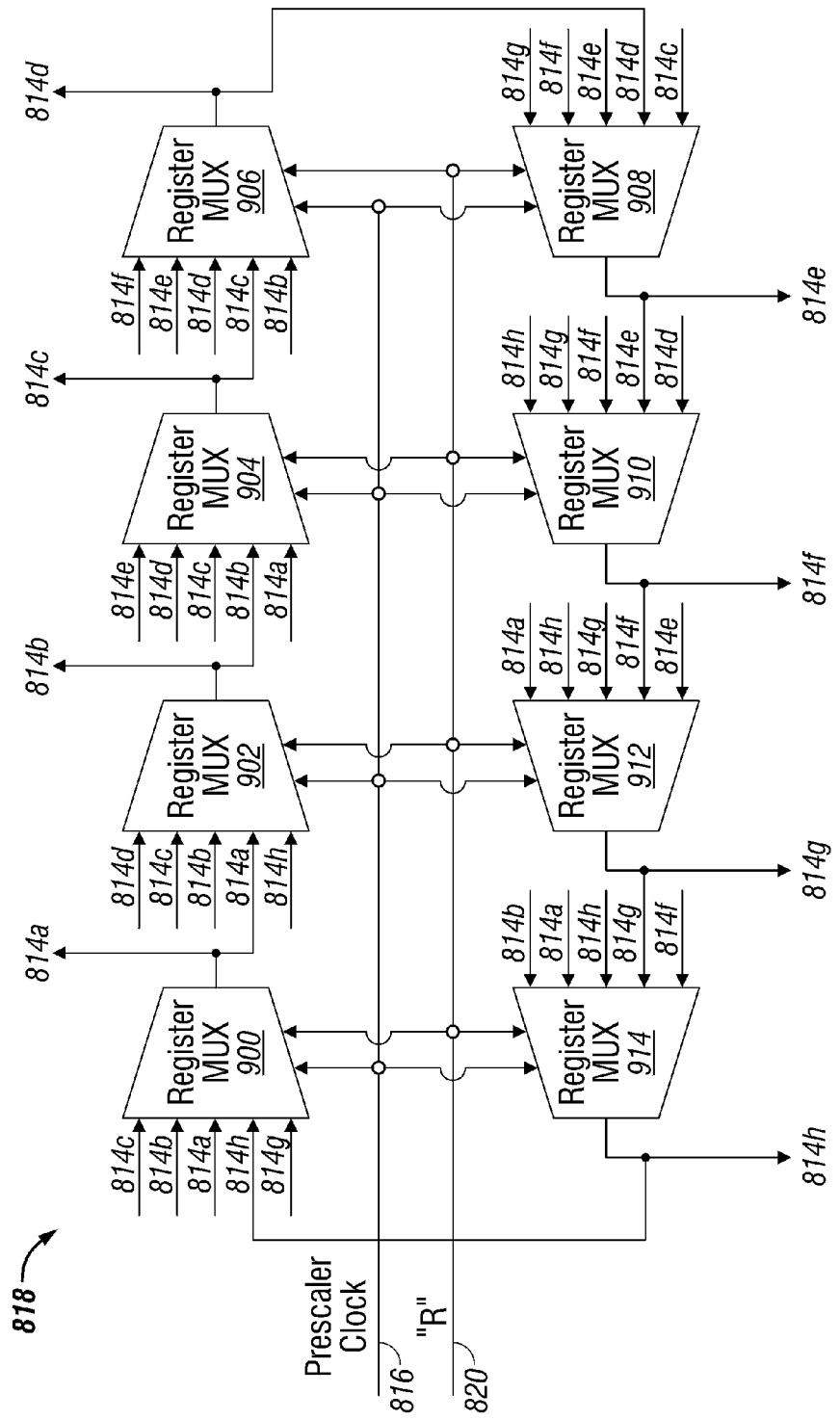
FIG. 9 is a block diagram depicting the daisy-chain controller of FIG. 8 in greater detail.

FIG. 9 is a block diagram depicting the daisy-chain controller of FIG. 8 in greater detail. The daisy-chain register controller 818 accepts the prescalar clock on line 816 as a clock signal to registers 900 through 914 having outputs connected in a daisy-chain. The controller 818 generates a sequence of register output pulses 814a through 814h in response to the clock signals, and uses the generated register output pulses to select the first clock phase outputs.

The daisy-chain register controller 818 iteratively selects sequences of register output pulses until a first pattern of register output pulses is generated. Then, the phase selection multiplexer (816, see FIG. 8) supplies phase output pulses having a non-varying first period, generating a prescalar clock frequency equal to the (first clock frequency)·S, where S is either an integer or non-integer number. Additional details of the high speed divider and daisy-chain controller may be found in parent application Ser. No. 11/717,261.

Although the above-described systems have been depicted as a combination of connected hardware elements, some aspects parts of the system may be enabled using software instructions stored in memory that are called and performed by a processor or logic-coded state machine device (not shown).

Functional Description

Figure 10:
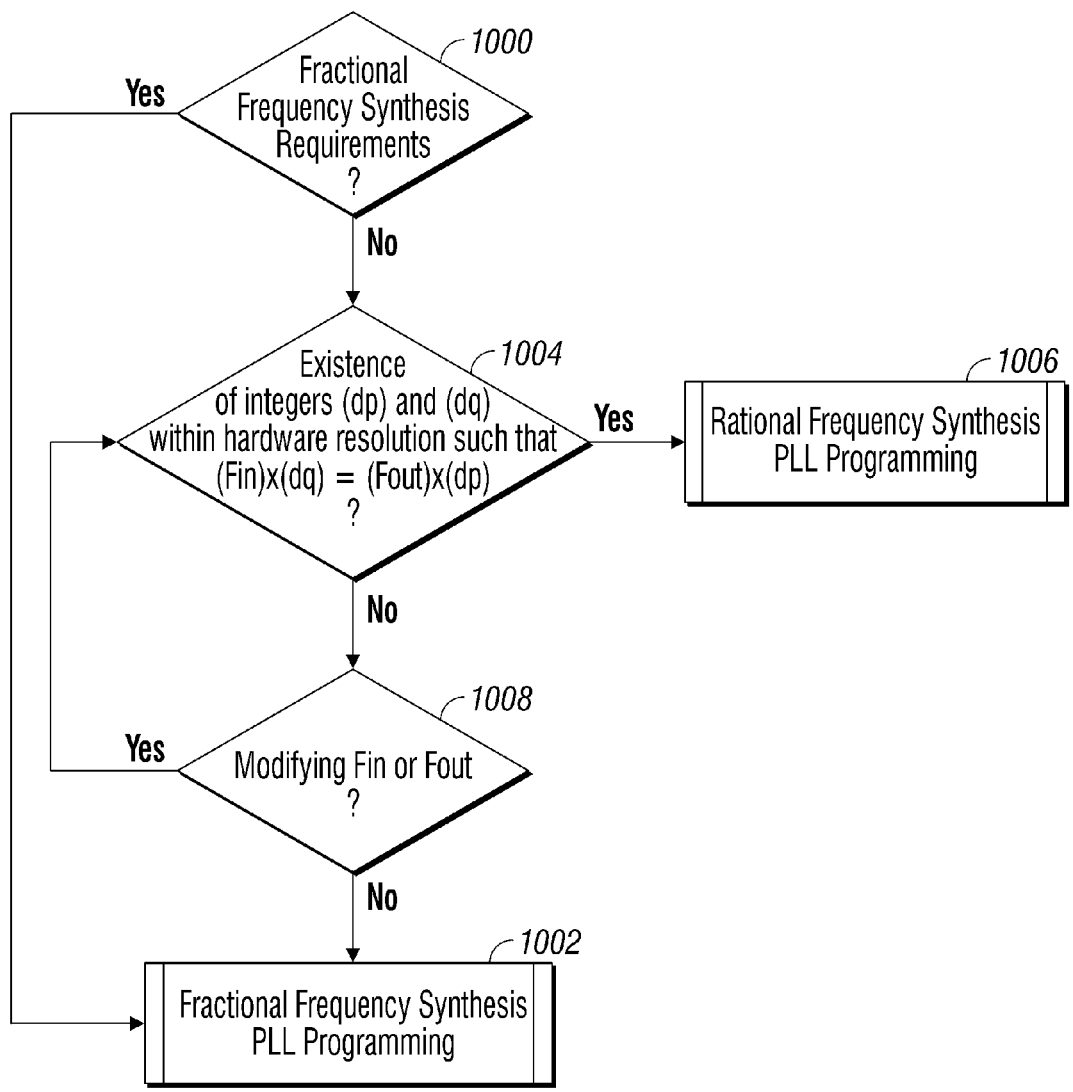
FIG. 10 is a flowchart illustrating an analysis performed in the rational division frequency synthesis system of FIG. 3.

FIG. 10 is a flowchart illustrating an analysis performed in the rational division frequency synthesis system of FIG. 3. F(in) is the reference frequency and F(out) is the synthesized frequency. In Step 1000 a decision is made to determine if the frequency synthesis divisor is a fractional number. Such a decision would be required when a PLL is initially configured or if the PLL operating frequencies are changed. If the answer is yes, the process goes to Step 1002, where the flexible accumulator module is enabled for conventional fractional division. If the answer is no, the process goes to Step 1004, where a decision is made as to whether p can be represented as an integer using j, or less, radix places, in the context of a system with a resolution limit of j radix places. If the answer is yes, the process goes to Step 1006, where the flexible accumulator module is enabled for rational division. If the answer is no, a decision is made as to whether F(in) or F(out) can be modified. If not, the process goes to Step 1002. If one of the frequencies is modified, the process returns to Step 1004, to determine if the new value of p can be resolved.

Figure 11:
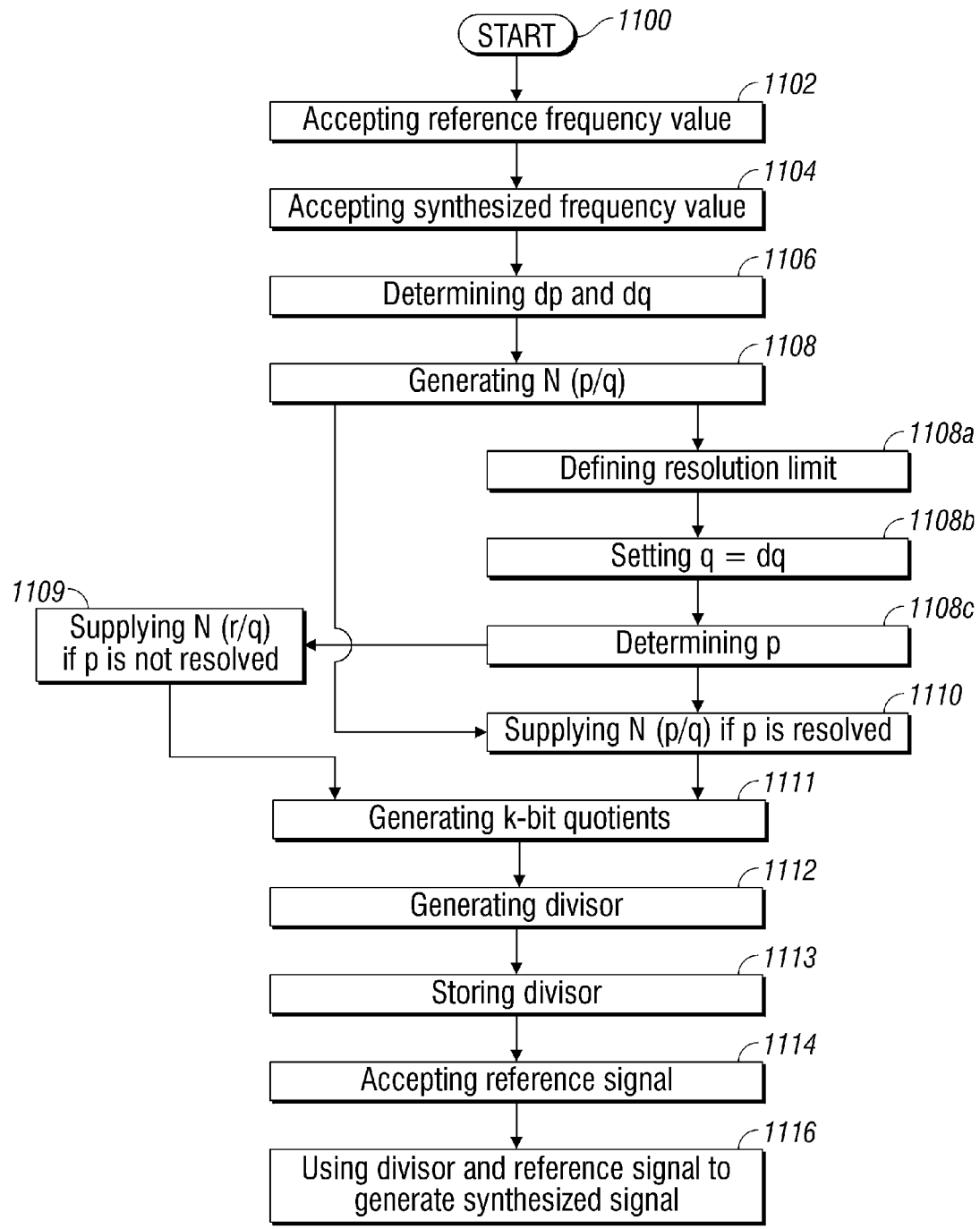
FIG. 11 is a flowchart illustrating a method for synthesizing signal frequencies using rational division in a frequency synthesis device.

FIG. 11 is a flowchart illustrating a method for synthesizing signal frequencies using rational division in a frequency synthesis device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 accepts a reference frequency value. Step 1104 accepts a synthesized frequency value. In response to dividing the synthesized frequency value by the reference frequency value, Step 1106 determines an integer value numerator (dp) and an integer value denominator (dq). Step 1108 reduces a ratio of dp/dq to an integer N and a ratio of p/q (dp/dq=N(p/q)), where p/q<1 (decimal). For example, p may be an n-bit binary numerator and p an (n+1)-bit binary denominator. Step 1110 supplies N(p/q) to a flexible accumulator module. Step 1112 generates a divisor. Step 1113 stores the divisor in a tangible memory medium.

In one aspect, generating a divisor in Step 1112 includes summing N with a k-bit quotient. Then, Step 1114 accepts a reference signal having a frequency equal to the reference frequency value. Step 1116 uses the divisor and the reference signal to generate a synthesized signal having a frequency equal to the synthesized frequency value.

In another aspect, supplying N(p/q) to the flexible accumulator module in Step 1110 includes supplying N(p/q) to a flexible accumulator module including a plurality of series-connected flexible accumulators. Then, Step 1111 generates the k-bit quotient as follows: generating a binary sequence from each flexible accumulator; and, using a plurality of binary sequences to generate the k-bit quotient.

In a different aspect, forming the ratio of p/q in Step 1108 includes substeps. Step 1108a defines a resolution limit of j radix places. Step 1108b sets q=dq. Step 1108c determines p. Then, 1110 supplies N(p/q) to a flexible accumulator module enabled for rational division when p can be represented as an integer using j, or less, radix places. Alternately, when p cannot be represented as an integer using j radix places, Step 1109 supplies N(r/q) to a flexible accumulator module enabled for fractional division, where r is a non-resolvable number.

In another aspect, Step 1108 reduces the ratio of dp/dq to the integer N and the ratio p/q includes reducing M(dp/dq) =N(p/q)). Generating the divisor in Step 1112 includes summing N, the k-bit quotient, and a multiplier value M. Then, using the divisor and the reference signal to generate the synthesized signal in Step 1116 includes dividing the synthesized signal by M to generate an output signal.

Figure 12:
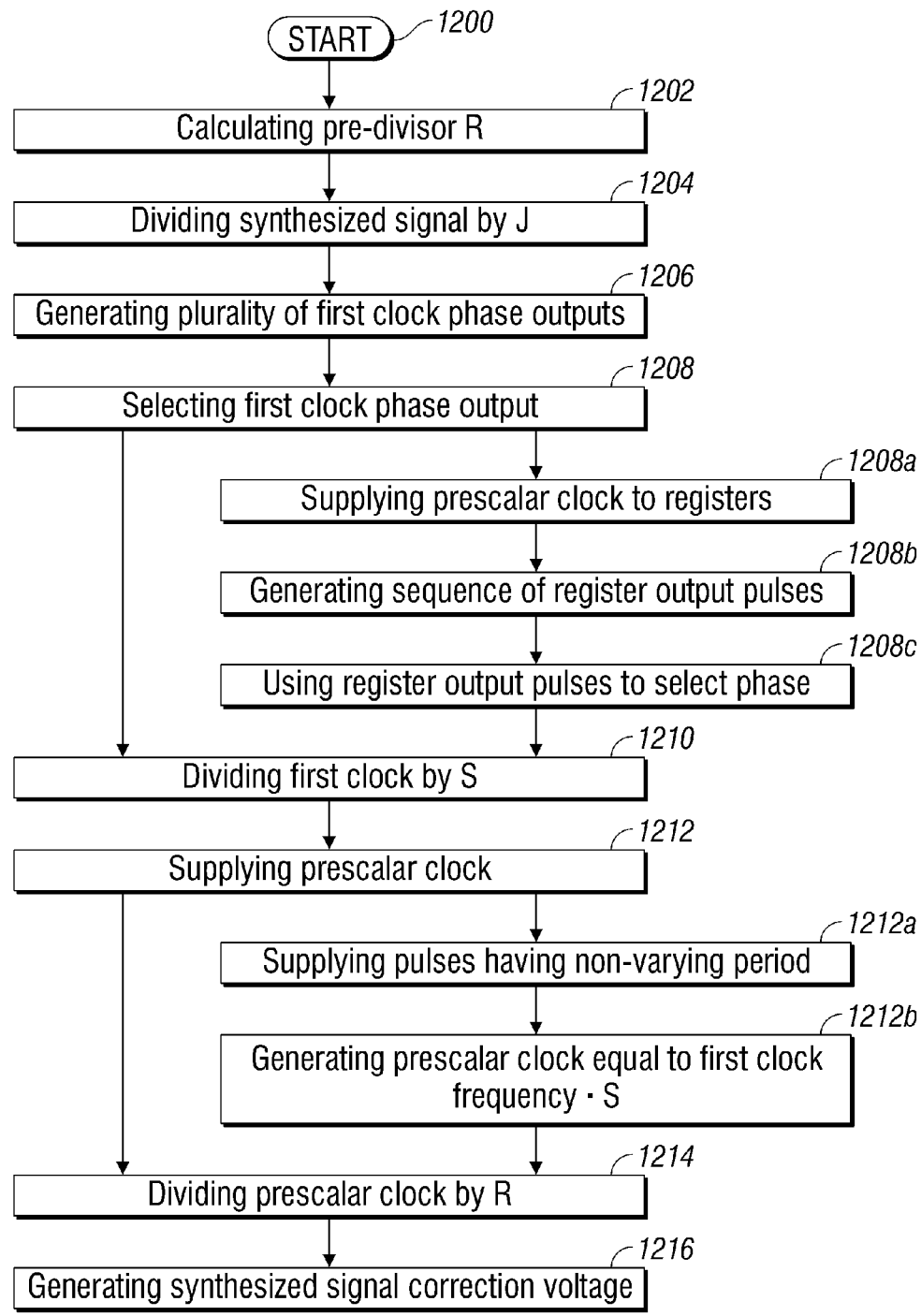
FIG. 12 is a flowchart detailing substeps in using the divisor and the reference signal to generate the synthesized signal, which is Step 1116 of FIG. 11.

FIG. 12 is a flowchart detailing substeps in using the divisor and the reference signal to generate the synthesized signal, which is Step 1116 of FIG. 11. Step 1202 calculates a pre-divisor R. Step 1204 divides the synthesized signal by the integer J, generating a first clock. Step 1206 generates a plurality of first clock phase outputs. Step 1208 uses a daisy-chain register controller to select first clock phase outputs. In response to selecting the first clock phase output, Step 1210 divides the first clock by an integer S. Step 1212 supplies a prescalar clock with a frequency equal to the (synthesized signal frequency)/R, where R=J·S. Step 1214 divides the prescalar clock frequency by the (divisor/R). Step 1216 compares the divided prescalar clock frequency to the reference clock frequency. Step 1218 generates a synthesized signal correction voltage.

In one aspect, generating the plurality of first clock phase output in Step 1206 includes generating a first number of equally-spaced phase outputs. Then, selecting first clock phase outputs using the daisy-chain register controller in Step 1208 includes substeps. Step 1208a supplies the prescalar clock as a clock signal to registers having outputs connected in a daisy-chain. Step 1208b generates a sequence of register output pulses in response to the clock signals. Step 1208c uses the generated register output pulses to select first clock phase outputs.

In another aspect, generating the sequence of register output pulses in Step 1208b includes iteratively selecting sequences of register output pulses until a first pattern of register output pulses is generated. Then, supplying the selected phase outputs as the prescalar clock in Step 1212 includes substeps. Step 1212a supplies phase output pulses having a non-varying first period. Step 1212b generates a prescalar clock frequency equal to the (first clock frequency) ·S, where S is either an integer or non-integer number.

A system and method have been provided that permit a frequency synthesis based upon either rational or fractional division. Some examples of circuitry and methodology steps have been given as examples to illustrate the invention. However, the invention is not limited to merely these examples. Likewise, the invention has been described in the context of binary numbers. However, the invention is not limited to any particular number base. Other variations and embodiments of the invention will occur to those skilled in the art.

We claim:

1. In a frequency synthesis device, a method for synthesizing signal frequencies using rational division, the method comprising:
    employing a processor that facilitates execution of computer executable instructions stored in a memory to perform operations, comprising:
        accepting a reference frequency value;
        accepting a synthesized frequency value;
        in response to dividing the synthesized frequency value by the reference frequency value, determining an integer value numerator (dp) and an integer value denominator (dq);
        reducing a ratio of dp/dq to an integer N and a ratio of p/q (dp/dq=N(p/q)), where p/q<1 (decimal);
        defining a resolution limit of j radix places;
        setting q=dq;
        determining p; and
        supplying N(p/q) to a flexible accumulator module enabled for rational division when p can be represented as an integer using j, or less, radix places.

2. The method of claim 1 further comprising:
    generating a divisor;
    storing the divisor in a tangible memory medium;
    accepting a reference signal having a frequency equal to the reference frequency value; and
    using the divisor and the reference signal to generate a synthesized signal having a frequency equal to the synthesized frequency value.

3. The method of claim 2 wherein supplying N(p/q) to the flexible accumulator module comprises supplying N(p/q) to a flexible accumulator module including a plurality of series-connected flexible accumulators, and generating the divisor comprises summing N with a k-bit quotient; and,
    the method further comprising:
        generating the k-bit quotient as follows:
            generating a binary sequence from each flexible accumulator; and,
            using a plurality of binary sequences to generate the k-bit quotient.

4. The method of claim 1 further comprising:
    when p cannot be represented as an integer using j radix places, supplying N(r/q) to a flexible accumulator module enabled for fractional division, where r is a non-resolvable number.

5. The method of claim 3 wherein generating the divisor comprises summing N, the k-bit quotient, and a multiplier value M; and,
    wherein using the divisor and the reference signal to generate the synthesized signal includes dividing the synthesized signal by M to generate an output signal.

6. The method of claim 5 wherein reducing the ratio of dp/dq to the integer N and the ratio p/q includes reducing M(dp/dq)=N(p/q).

7. The method of claim 2 wherein using the divisor and the reference signal to generate the synthesized signal comprises:
    calculating a pre-divisor R;
    dividing the synthesized signal by the integer J, generating a first clock;
    generating a plurality of first clock phase outputs;

using a daisy-chain register controller to select first clock phase outputs;

in response to selecting the first clock phase output, dividing the first clock by an integer S;

supplying a prescalar clock with a frequency equal to the ((synthesized signal frequency)/R), where R=J·S;

dividing the prescalar clock frequency by the (divisor/R);

comparing the divided prescalar clock frequency to the reference clock frequency; and, generating a synthesized signal correction voltage.

8. The method of claim 7 wherein generating the plurality of first clock phase output comprises generating a first number of equally-spaced phase outputs; and, wherein selecting first clock phase outputs using the daisy-chain register controller comprises:

supplying the prescalar clock as a clock signal to registers having outputs connected in a daisy-chain;

generating a sequence of register output pulses in response to the clock signals; and, using the generated register output pulses to select first clock phase outputs.

9. The method of claim 8 wherein generating the sequence of register output pulses includes iteratively selecting sequences of register output pulses until a first pattern of register output pulses is generated;

wherein supplying the selected phase outputs as the prescalar clock comprises:

supplying phase output pulses having a non-varying first period; and, generating a prescalar clock frequency equal to the ((first clock frequency)·S), where S comprises integer or non-integer numbers.

10. The method of claim 1 wherein supplying N(p/q) to flexible accumulator module comprises supplying an n-bit binary numerator and an (n+1)-bit binary denominator.

11. A system for synthesizing signal frequencies using rational division, the system comprising:

a calculator having an input to accept a reference frequency value and an input to accept a synthesized frequency value, the calculator for dividing the synthesized frequency value by the reference frequency value, for determining an integer value numerator (dp) and an integer value denominator (dq), for reducing a ratio of dp/dq to an integer N and a ratio of p/q (dp/dq=N(p/q)), where p/q<1 (decimal), defining a resolution limit of i radix places, setting q=dq, determining p, and for supplying the numerator (p) and the denominator (q) at an output; and, a flexible accumulator module having an input to accept N(p/q) and an output to supply a divisor, wherein the flexible accumulator module is enabled for rational division when p can be represented as an integer using i, or less, radix places.

12. The system of claim 11 further comprising:

a phase-locked loop (PLL) comprising a phase/frequency detector (PFD), frequency synthesizer, and feedback loop divider, the PFD for accepting a reference signal having a frequency equal to the reference frequency value and the frequency synthesizer for generating a synthesized signal having a frequency equal to the synthesized frequency value; and, wherein the flexible accumulator module sums N with a k-bit quotient, creates the divisor, and supplies the divisor to the feedback loop divider.

13. The system of claim 11 wherein the flexible accumulator module comprises a plurality of series-connected flexible accumulators, the flexible accumulator module for generating a binary sequence from each flexible accumulator and for using a plurality of binary sequences to generate the k-bit quotient.

14. The system of claim 11 wherein the calculator supplies N(r/q) to a flexible accumulator module enabled for fractional division, where r is a non-resolvable number, when p cannot be represented as an integer using j radix places.

15. The system of claim 12 wherein the PLL comprises a feedforward divider configured to accept the synthesized signal and an output configured to supply an output signal having a frequency=(synthesized signal frequency)/M; and, wherein the flexible accumulator module creates the divisor by summing N, the k-bit quotient, and M.

16. The system of claim 15 wherein the calculator reduces to ratio M(dp/dq)=N(p/q).

17. The system of claim 12 wherein the feedback loop divider comprises a high-speed division module and a low-speed division module;

wherein the high-speed module comprises:

a divider having an input to accept the synthesized signal and an output to supply a first clock signal having a frequency equal to the (synthesized signal frequency)/J;

a phase module having an input to accept the first clock and an output configured to supply a plurality of phase outputs, each having the first clock frequency;

a phase selection multiplexer having an input to accept the plurality of first clock phase outputs, an input configured to accept a control signal for selecting a first clock signal phase, and an output configured to supply a prescalar clock with a frequency equal to the ((synthesized signal frequency)/R), where R=J·S;

a daisy-chain register controller having an input to accept the pre-divisor value R and an output configured to supply the control signal for selecting the first clock phase outputs;

a low-speed module having an input to accept the prescalar clock and an output configured to supply a divided prescalar clock with a frequency equal to the (divisor/R); and, wherein the PFD compares the divided prescalar clock frequency to the reference clock frequency and generates a synthesized signal correction voltage.

18. The system of claim 17 wherein the phase module generates a first clock with a first number of equally-spaced phase outputs; and, wherein the daisy-chain register controller accepts the prescalar clock as a clock signal to registers having outputs connected in a daisy-chain, generates a sequence of register output pulses in response to the clock signals, and uses the generated register output pulses to select the first clock phase outputs.

19. The system of claim 18 wherein the daisy-chain register controller iteratively selects sequences of register output pulses until a first pattern of register output pulses is generated; and, wherein the phase selection multiplexer supplies phase output pulses having a non-varying first period, generating a prescalar clock frequency equal to the ((first clock frequency)·S), where S comprises integer or non-integer numbers.

20. The system of claim 11 wherein the calculator supplies an n-bit binary numerator (p) and an (n+1)-bit binary denominator (q).

* * * * *